United States Patent
Hirose et al.

(10) Patent No.: US 8,161,346 B2
(45) Date of Patent: Apr. 17, 2012

(54) DATA REFRESH APPARATUS AND DATA REFRESH METHOD

(75) Inventors: Tatsuo Hirose, Hamura (JP); Hidehito Izawa, Hanno (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 992 days.

(21) Appl. No.: 12/129,754

(22) Filed: May 30, 2008

(65) Prior Publication Data

US 2008/0301525 A1    Dec. 4, 2008

(30) Foreign Application Priority Data

May 31, 2007   (JP) ................................ 2007-145358

(51) Int. Cl.
*H03M 13/00* (2006.01)
(52) U.S. Cl. ...................................................... 714/754
(58) Field of Classification Search .................. 714/746, 714/754, 763–764, 784; 711/106; 365/222
See application file for complete search history.

(56) References Cited

U.S. PATENT DOCUMENTS

| | | | | |
|---|---|---|---|---|
| 4,766,573 A * | 8/1988 | Takemae | ....................... | 365/222 |
| 5,563,896 A * | 10/1996 | Nakaguchi | ..................... | 714/785 |
| 6,199,139 B1 * | 3/2001 | Katayama et al. | ............ | 711/106 |
| 6,853,602 B2 * | 2/2005 | Huang | ........................... | 365/222 |
| 7,373,584 B2 * | 5/2008 | Ito et al. | ........................ | 714/763 |
| 7,613,880 B2 * | 11/2009 | Miura et al. | ................... | 711/115 |

FOREIGN PATENT DOCUMENTS

| | | |
|---|---|---|
| JP | 02-083645 | 3/1990 |
| JP | 2004-152194 | 5/2004 |
| JP | 2006-079229 | 3/2006 |

* cited by examiner

*Primary Examiner* — Shelly A Chase
(74) *Attorney, Agent, or Firm* — Pillsbury Winthrop Shaw Pittman, LLP

(57) ABSTRACT

According to one embodiment, a data refresh apparatus which refreshes data stored in a storage device having storage areas, comprises an error detector configured to detect a number of errors of data stored in a storage area of the storage device, an error correction unit configured to execute an error correction for the data stored in the storage area and generate corrected data, a refresh unit configured to write the corrected data to one of the storage areas, and a refresh controller configured to control an operation cycle of the refresh unit according to a number of times of write operations with respect to the storage area.

14 Claims, 3 Drawing Sheets

Data table 13a

| Page | 1 | 2 | 3 | .... | n | .... |
|---|---|---|---|---|---|---|
| Number W of write operations | 100 times | 150 times | 1000 times | .... | 10 times | .... |
| Cycle | 10 days | 8 days | 3 days | .... | 30 days | .... |

US 8,161,346 B2

DATA REFRESH APPARATUS AND DATA REFRESH METHOD

CROSS-REFERENCE TO RELATED APPLICATIONS

This application is based upon and claims the benefit of priority from Japanese Patent Application No. 2007-145358, filed May 31, 2007, the entire contents of which are incorporated herein by reference.

BACKGROUND

1. Field

One embodiment of the present invention relates to a data refresh apparatus and a data refresh method.

2. Description of the Related Art

In a storage device such as a flash memory and a hard disk device, data tends to be more easily corrupted as the number of times of performed data write-operations increases. The number of data-write operations which can be performed in this type of storage device has a limitation.

When writing data to the storage device, an error bit may occur and the data will be corrupted in some cases. An error-correction code (ECC) is added to the data and stored; therefore, even when the data is corrupted, the data can be corrected.

As an encoding method of the error-correction code, a parity check method, check sum method, CRC method and the like are provided. Jpn. Pat. Appln. KOKAI Publication No. 2004-152194 discloses a memory data protection method which adds to data an error-correction code which is encoded based on an encoding method corresponding to importance of information or frequency of error occurrence.

In the above memory data protection method, the number of times of error detections performed in each block is stored and adequate error detection and adequate correction coding are selected to execute encoding based on the number of times of the error detections. When the number of error detections performed in one block becomes equal to or larger than a certain value, it is considered that an error will reoccur with a high probability and the encoding of information, which is to be written to the block, is changed into an encoding method having high error detection/correction capability. Further, when the number of error detections performed in one block exceeds a predetermined maximum value, it is considered that information cannot be ensured in the block. The information is saved to another block and the above block will not be used any more.

Thus, adding an ECC to data and storing the same allow correction of corrupted data.

In the memory data protection method, however, every time the data is corrected, the corrected data is written in the block to increase the number of times of performed data-write operations. In the case in which the data correction is executed frequently, the number of performed data-write operations approaches to the limit of writing operations. Accordingly, the data becomes easy to be corrupted.

Furthermore, in the above memory data protection method, even in the case where a large portion of data is corrupted, data saving is kept unexecuted until the predetermined maximum number of error detections is executed. Thus, uncorrectable serious data corruption can occur before the number of error detections reaches the predetermined value.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, a data refresh apparatus which refreshes data stored in a storage device having storage areas, comprises an error detector configured to detect a number of errors of data stored in a storage area of the storage device, an error correction unit configured to execute an error correction for the data stored in the storage area and generate corrected data, a refresh unit configured to write the corrected data to one of the storage areas, and a refresh controller configured to control an operation cycle of the refresh unit according to a number of times of write operations with respect to the storage area.

With reference to the accompanying drawings, an embodiment of the present invention will be described.

Figures 1, 2:
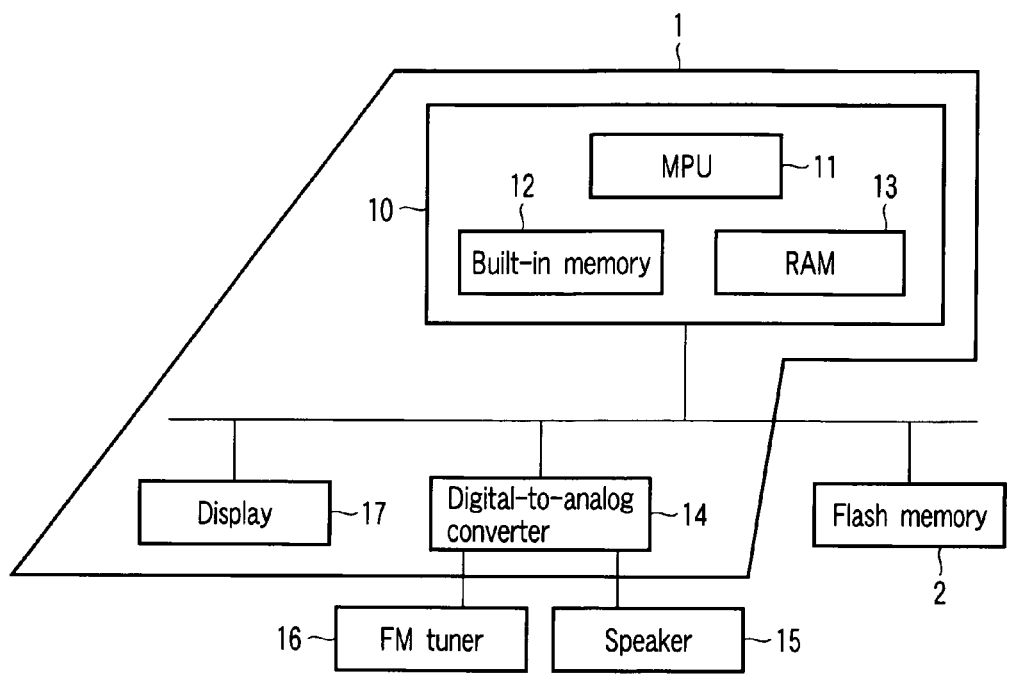
FIG. 1 is an exemplary block diagram showing an electrical configuration of a data refresh apparatus according to an embodiment of this invention.
FIG. 2 is an exemplary view showing an example of data contents stored in a data table.

FIG. 1 is an exemplary block diagram showing an electrical configuration of a portable audio player apparatus with an FM tuner having a data refresh function according to the embodiment.

A data refresh apparatus according to the present embodiment includes a main body 1. A flash memory 2 is detachably mounted to the main body 1. The flash memory 2 can be contained in the main body 1.

The flash memory 2 is a storage device such as a NAND flash memory. The flash memory 2 stores various types of file data items such as image data, audio data and personal computer data. File data may be written to the flash memory 2 using another device (not shown) as well as the main body 1 itself. For this purpose, the main body 1 includes an input terminal (not shown) such as a USB terminal to which file data from exterior is input. The operation of writing data to the flash memory 2 or reading data therefrom is performed by a unit of page having plural bytes (for example, 512 bytes+16 redundant bytes). In order to correct an error bit which occurs at the data write time, an error-correction code (ECC) is added to the data for each page and stored. Data tends to be corrupted easily in a page in which a large number of write operations have been performed and/or a large number of read operations have been performed. When reading data stored in the flash memory 2, the ECC is read together with the stored data and the error-correction process is performed.

The main body 1 includes a controller 10. The controller 10 includes a micro processing unit (MPU) 11, a built-in memory 12 and a RAM 13. A display 17 is connected to the controller 10. Also a speaker 15 and an FM tuner 16 are connected to the controller 10 via a digital-to-analog converter 14.

The MPU 11 controls, using the RAM 13 as a work memory, the operations of the respective portions of the apparatus based on a control program which is prestored in the built-in memory 12.

The controller 10 controls a refreshing process for data stored in the flash memory 2 based on a data refresh program prestored in the built-in memory 12. The data refresh program may be previously stored in the flash memory 2.

The built-in memory 12 is a storage device such as a ROM contained in the main body 1. The built-in memory 12 prestores various program data items such as the above control program and data refresh program.

A storage area such as a data table 13a is provided in the RAM 13.

FIG. 2 is an exemplary view showing an example of the data contents stored in the data table 13a.

The data table 13a stores refresh cycle data and the number of times of data-write operations performed in respective pages of the flash memory 2. When data is written to the flash memory 2, the value of the number W of write operations for a corresponding page is incremented by one. When the refresh cycle of any one of the pages is changed as a result of a memory data refresh process, which will be described later, corresponding refresh cycle data will be rewritten. As an initial value of the refresh cycle data, a constant value is set for every page. The initial values of the number of write operations for the respective pages are all set to zero.

Audio data stored in the flash memory 2 is subjected to an error detection/correction process by the controller 10, then converted into an analog audio signal by use of the digital-to-analog converter 14 and output from the speaker 15.

The display 17 is a display device such as an LCD and is used to display an image file and the like stored in the flash memory 2.

Next, a data refresh process performed by use of the data refresh apparatus with the above configuration will be explained.

Figure 3:
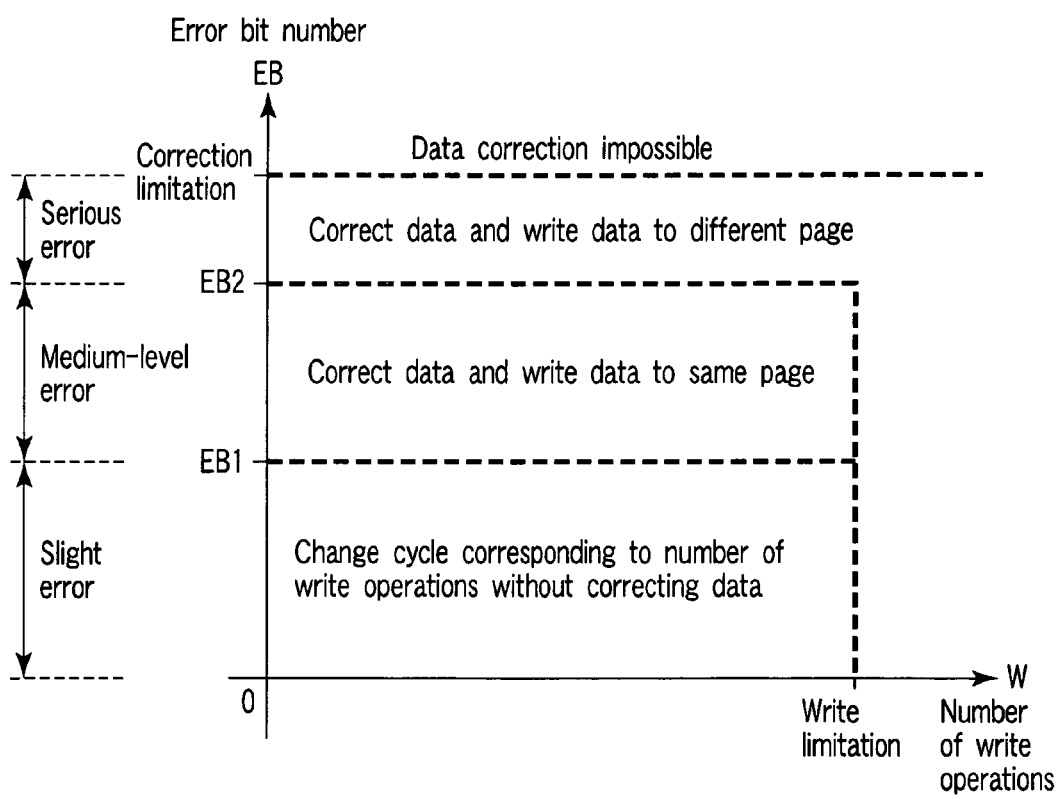
FIG. 3 is an exemplary view showing data refresh processes to be performed depending on degree of data corruption and the number of write operations.

FIG. 3 is an exemplary view showing an example of data refresh processes performed depending on degree of data corruption and the number of write operations.

As shown in FIG. 3, in the present embodiment, the contents of the data refresh process are determined according to the number W of write operations and the number EB of error bits for each page.

In a page in which greater data corruption has been occurred, a larger number of error bits are generated. That is, the error bit number EB represents the degree of data corruption.

When the error bit number EB exceeds a preset correction limitation bit number, an occurred error cannot be corrected even by use of an error-correction code (ECC). The correction limitation is determined according to physical properties of the flash memory 2, an ECC encoding system and the like. When the error bit number (EB) of one page exceeds the correction limitation, it is determined that data stored in the page is lost.

When the error bit number EB is not larger than the preset correction limitation bit number, the occurred error can be corrected to restore correct data. A location to which the restored data is written is determined as follows.

When the data write operations are repeatedly performed in one page, storage characteristics of the page will be deteriorated and data tends to be easily corrupted. For example, a page for which the number of times of performed write operations becomes larger than the preset write limitation has a high probability that data therein will be corrupted. The write limitation is also determined based on the physical properties of the flash memory 2 and the like.

In the present embodiment, even when correction of data stored in a page in which write operations more than the write limitation have been performed is possible using the ECC, the data is not written to the page (data is not written back) but written to another page (data is rewritten). This process is called a saving process.

A page for which the number of write operations performed therein is not larger than the write limitation and the error bit number is relatively small can be regarded as a page not having a serious error which should be corrected.

In a page for which the number of error bits lies in a slight error region (a region in which the number of error bits is equal to or smaller than a preset bit number EB1) shown in FIG. 3, it is determined that the degree of data corruption is low and the corrected data is not required to be written back.

For example, in the case where the degree of the error stored in the flash memory 2 is low, the number of write operations is rather increased if data is corrected and rewritten each time even when such a slight error is detected. When the number of write operations is thus increased, data tends to be easily corrupted. Therefore, such a slight error is regarded as an error which can be neglected and will not be corrected. In this case, only the process for changing the refresh cycle corresponding to the number of write operations is performed.

Data tends to be more easily corrupted in a page in which a larger number of write operations has been executed. Therefore, it is preferable to shorten the refresh cycle for a page in which the number of write operations is larger and to perform the data refresh process before data is corrupted. However, if the data refresh process is frequently performed for data stored in a page for which the number of write operations is small, the rewriting process will even rather increase the number of performed write operations. As a result, the data comes to be more easily corrupted. The refresh cycle (period) can be set longer for a page in which the small number of write operations has been performed.

In a page for which the number of performed write operations does not exceed the write limitation and the degree of data corruption is an intermediate degree, it is considered that the data corruption cannot be neglected. That is, the data is considered to be corrupted to some extent and is required to be corrected, for a page having the error bit number EB which lies in a medium-level error region of FIG. 3 (a region in which the error bit number is larger than the preset bit number EB1 and is not larger than a preset bit number EB2).

Data stored in a page of the medium-level error region is corrected using the ECC data. The thus corrected data is written to the same page again.

In a page for which the number of write operations does not exceed the write limitation but the degree of data corruption is relatively high, it is necessary to make a data correction and write the thus corrected data to another page. That is, although the data is correctable, the data is considerably corrupted in a page in which the error bit number lies in a serious error region shown in FIG. 3 (a region in which the error bit number is larger than EB2 and is not larger than the correction limitation). The data stored in such a page can be corrected by use of the ECC data. However, if the data is held in such a page any longer, the correction limitation will be reached at some future time. Data will be completely corrupted when exceeding the correction limitation and the data correction becomes impossible. Therefore, it is necessary to rewrite thus corrected data to another page to save the data.

The preset bit numbers EB1 and EB2 are determined based on the physical properties of the flash memory 2, the encoding system of the ECC and the like.

Next, the processing procedure of the data refresh process will be explained.

Figure 4:
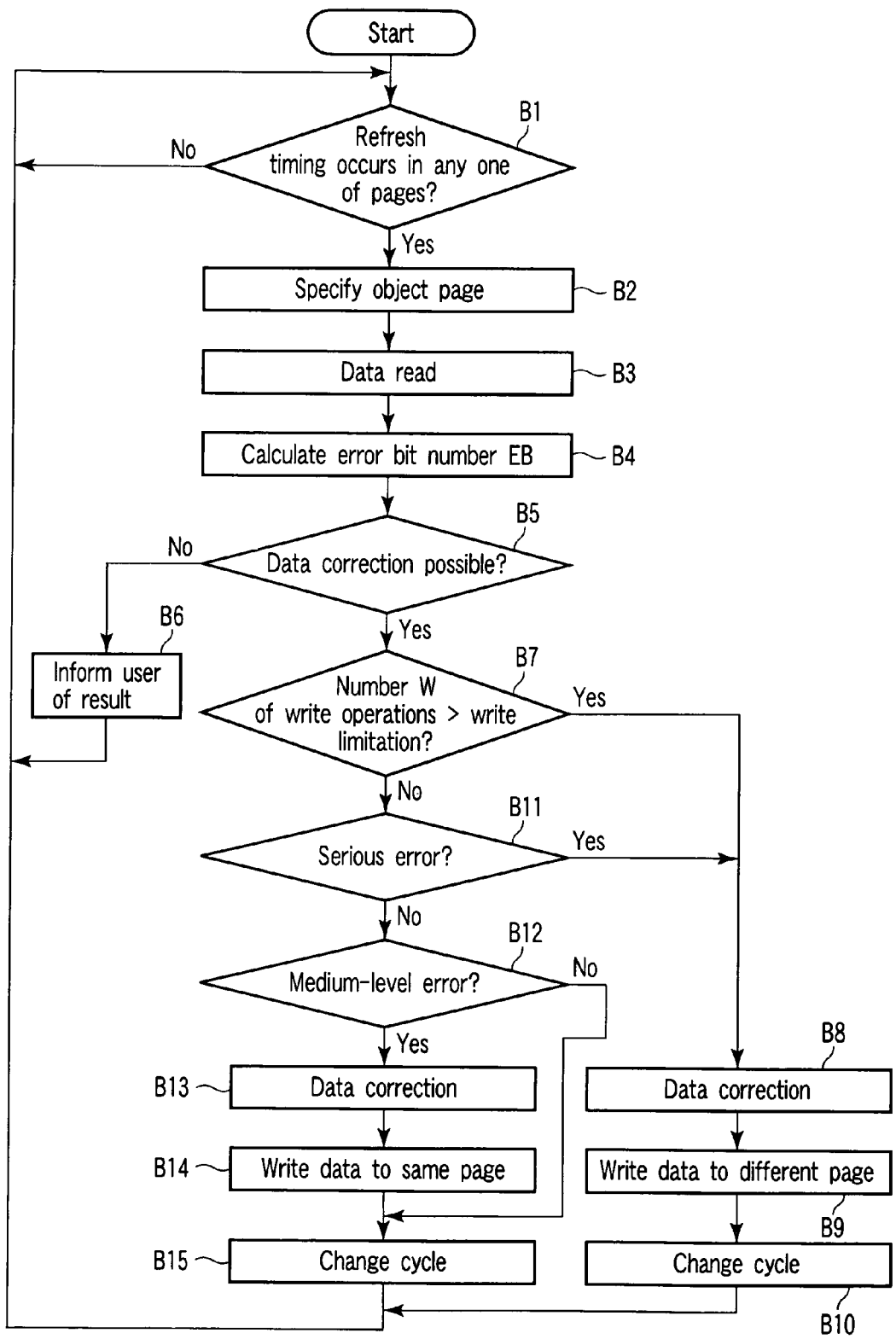
FIG. 4 is an exemplary flowchart for illustrating a data refresh process by the data refresh apparatus.

FIG. 4 is an exemplary flowchart for illustrating the data refresh process executed by the data refresh apparatus.

First, the MPU 11 determines based on refresh cycle data stored for each page in the data table 13a (refer to FIG. 2) whether or not any of the pages comes to a refresh timing (block B1). When it is determined that one of the pages is at the refresh timing (YES in block B1), the MPU 11 specifies the page as an object page which is to be subjected to the refresh process (block B2).

Then, data stored in the specified object page and corresponding ECC data are read from the flash memory 2 (block B3).

Calculation of the number EB of error bits contained in the ECC data is executed based on the read ECC data (block B4). The MPU 11 determines based on the calculated error bit number EB whether or not the read data can be corrected (block B5).

When the error bit number EB calculated in block B4 is larger than the preset correction limitation, it is determined that the data of the object page cannot be corrected even by using ECC data (refer to FIG. 3). The correction limitation is determined based on the physical properties of the refresh memory 2, the ECC encoding system and the like.

When the data is not correctable (NO in block B5), it is determined that data of the object page is corrupted. It is informed to the user that data is corrupted (block B6). That is, in block B6, for example, a process of causing the display 17 to display an error message or causing the speaker 15 to issue an alarm sound is performed to inform the user that data corruption is occurred.

When the error bit number EB is not larger than the correction limitation, it is determined that the data is correctable (YES in block B5).

Then, it is determined whether or not the number W of times of write operations performed in the object page is larger than the write limitation (block B7). The write limitation is the maximum number of times of write operations which ensures stable data writing. When the number of write operations performed in one page is larger than the write limitation, the probability that data is corrupted becomes high. The write limitation is also determined based on the physical properties of the flash memory 2, ECC encoding system and the like.

When the number W of write operations exceeds the write limitation (YES in block B7), it is necessary to correct data and rewrite the corrected data to another page. Therefore, an error correction process using ECC data is performed for data of the object page (block B8).

The corrected data is written to another writable page (saving page) (block B9). Further, since the number W of write operations exceeds the write limitation in the object page, the page is determined as a page having a high probability that data will be corrupted if data is held any further. Thereafter, a process of writing data to such a page is disabled. The refresh cycle of the saving page to which the corrected data is written is set according to the number of write operations performed in the saving page (block B10). That is, the refresh cycle of the saving page stored in the data table 13a is converted to a cycle corresponding to the number of performed write operations. Since the probability that data will be corrupted becomes higher as the number of write operations becomes larger, the refresh cycle is shortened.

When it is determined that the number of write operations performed in the object page is smaller than the write limitation (NO in block B7), the degree of data corruption in the object page is determined (blocks B11 and B12).

The degree of data corruption is determined based on the value of the error bit number EB. In a page in which the error bit number EB is larger, the degree of data corruption becomes higher.

When the error bit number EB of the object page lies in the serious error region of FIG. 3 (the error bit number EB is not larger than the correction limitation bit number and is larger than EB2), it is determined that the degree of data corruption is seriously high (YES in block B11). When the degree of data corruption is seriously high, it is necessary to correct data of the object page and rewrite the data to another page in which data can be written. Therefore, the data of the object page is corrected by using ECC data (block B8).

The thus corrected data is rewritten to another page (saving page) to which data can be written (block B9). Further, the object page is determined as a page having a high probability that data is corrupted if data is held any further. Thereafter, a process of writing data to such a page is disabled. The refresh cycle of the saving page to which the corrected data is written is set according to the number of write operations performed in the saving page (block B10). That is, the refresh cycle of the saving page stored in the data table 13a is converted to a cycle corresponding to the number of write operations.

When the error bit number EB of the object page lies in the medium-level error region (the error bit number EB is not larger than EB2 but is larger than EB1), it is determined that the data corruption in the object page is at an intermediate degree (NO in block B11 and YES in block B12). When the degree of data corruption is at the intermediate degree, it is necessary to correct the data of the object page. Therefore, data of the object page is corrected by using ECC data (block B13).

When the degree of data corruption is intermediate, the corrected data is written to the object page again (block B14). Thereafter, the refresh cycle of the object page is changed according to the number of write operations performed in the object page (block B15). That is, the refresh cycle of the object page stored in the data table 13a is changed to a cycle corresponding to the number of write operations.

When the error bit number EB of the object page lies in the slight error region of FIG. 3 (the error bit number EB is not larger than EB1), it is determined that the degree of corruption is low (NO in blocks B11 and B12). When the degree of corruption is low, it is not necessary to make an error correction. Therefore, data is not corrected and only a process of changing the refresh cycle of the object page is performed. That is, the refresh cycle of the object page stored in the data table 13a is changed to a cycle corresponding to the number W of write operations performed in the object page (block B15).

Thereafter, the process returns to block B1 and the MPU 11 waits until the refresh timing of any one of the pages will come.

As described above, according to the present embodiment, data in a memory can be properly protected for each page according to the frequency of data write operations and the degree of data corruption.

That is, according to the data refresh process of the present embodiment, the data refresh cycle can be changed according to the frequency of data write operations for each page. Therefore, the refresh cycle is set longer for a page in which the frequency of data-write operations is lower and an unnecessary increase in the number of data write operations due to the data correction process can be prevented. On the other hand, the refresh cycle is set shorter for a page in which the frequency of data-write operations is higher, data is saved to another page before the data correction becomes impossible and thus the data can be protected.

According to the present embodiment, when the number of data write operations performed in one page exceeds a preset write limitation, corrected data can be saved to another page. On the other hand, when the number of data-write operations performed in one page does not exceed the write limitation, a process corresponding to the degree of corruption can be performed. That is, when an error occurring in the object page is a slight error, an error correction is not made, when the error is a medium-level error, data is corrected and written to the original page, and when the error is a serious error, data is corrected and written to another page. Therefore, when the occurred error is a slight error which can be neglected, the error correction is not made. Thus, an increase in the number of data-write operations can be prevented and data corruption caused by the increase in the number of data-write operations can be prevented. When serious corruption of data which lies close to the correction limitation occurs, the data can be protected by saving the data to another page.

Modification

This invention is not limited to the above embodiment and can be variously modified. For example, in the above explanation, the refresh cycle is changed according to the number of write operations performed in each page. However, the refresh cycle can be set or changed by unit of a block having a plurality of pages. In this case, the number of write operations and the number of erase operations are stored for each block. Depending on the stored number of write operations and the stored number of erase operations, the refresh cycle of a corresponding block is changed. Particularly, in the case of a flash memory (for example, a NAND flash memory) in which a data erase operation is performed in the unit of a block, the probability that data is corrupted is high in a block in which the data write operations and erase operations are frequently performed. Setting and changing the refresh cycle by the unit of block allows data protection according to the number of data erase operations.

Further, to set or change the refresh cycle for each of the pages, the number of write operations performed in each of the pages and the number of erase operations performed in each of blocks may be used. In this case, the number of write operations is stored for each page and the number of erase operations is stored for each block. The refresh cycle of a target page can be changed according to both of the number of write operations in the object page and the number of erase operations in the block containing the object page.

In the above embodiment, the data refresh process is performed on data stored in the flash memory 2. However, an object to be subjected to the memory data refresh process is not limited to the flash memory. The data refresh process according to the above embodiment can be applied to a storage device such as an EPROM in which data read operations and data write operations can be performed.

In the above embodiment, the contents of the refresh process are determined based on the number of write operations and the number of error bits. However, the contents of the refresh process may be determined based only on the number of write operations. In this case, the determinations in blocks B11 and B12 of FIG. 4 are not performed. The contents of the refresh process are determined according to the number of write operations irrespective of the degree of errors. Alternatively, the contents of the refresh process may be determined based only on the number of error bits. In this case, the determination in block B7 of FIG. 4 is not performed.

In the above embodiment, when the refresh timing of any one of the pages has come, the refresh process is performed. However, the memory data refresh process may be performed in a preset operation cycle. The preset operation cycle is set shorter than the refresh cycle of each page. In this case, the controller 10 performs the following process in the preset operation cycle. The following process is performed for all of the pages. That is, the controller 10 detects the refresh cycle of one page and determines whether or not execution of the refresh process is required for the page. When it is determined that the refresh process is not required, the process after block B2 of FIG. 4 will not be performed, the refresh cycle of a next page is detected and the same determination is performed. Such determination is performed for all of the pages and when a page for which the refresh process is required is detected, the processing after block B2 of FIG. 4 is performed for the detected page.

In the above described embodiment, when the number of write operations does not exceed the write limitation and the error bit number EB is not larger than EB1, only the process for changing the cycle corresponding to the number of write operations is performed without making a data correction (refer to FIG. 3). However, even when the error bit number EB is not larger than EB1, the data correction may be made. In this case, the distinction between the medium-level error region and the slight error region explained in the above embodiment is removed.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A data refresh apparatus which refreshes data stored in a storage device having storage areas, comprising:
an error detector configured to detect a number of errors of data stored in a storage area of the storage device;
an error correction unit configured to execute an error correction for the data stored in the storage area and generate corrected data;
a refresh unit configured to write the corrected data to one of the storage areas;
a refresh controller configured to control an operation cycle of the refresh unit according to a number of times of write operations with respect to the storage area; and
a storage unit configured to store numbers of times of write operations with respect to the storage areas,
wherein the refresh controller is configured to control the operation cycle of the refresh unit based on the numbers of times of write operations stored in the storage unit.

2. The data refresh apparatus according to claim 1, wherein the refresh unit writes the corrected data to the storage area when the number of errors of the data stored in the storage area detected by the error detector is not larger than a first preset number, and writes the corrected data to a different storage area when the number of errors is larger than the first preset number.

3. The data refresh apparatus according to claim 1, wherein the refresh unit operates in a preset cycle and the refresh controller changes the preset cycle according to the number of times of write operations.

4. The data refresh apparatus according to claim 2, wherein the error correction unit does not execute the error correction when the number of errors detected by the error detector is not larger than a second preset number which is smaller than the first preset number.

5. The data refresh apparatus according to claim 1, wherein the error detector detects the number of errors based on an error-correction code stored in the storage area.

6. The data refresh apparatus according to claim 1, wherein the error correction unit executes the error correction based on an error-correction code stored in the storage area.

7. A data refresh method used in a data refresh apparatus which refreshes data stored in a storage device having storage areas, the data refresh method comprising:
   detecting a number of errors of data stored in a storage area of the storage device;
   executing an error correction for data stored in the storage area to generate corrected data;
   writing the corrected data to one of the storage areas; and
   controlling an operation cycle of writing the corrected data according to a number of times of write operations with respect to the storage area; and
   storing numbers of times of write operations with respect to the storage areas,
   wherein the controlling comprises controlling the operation cycle of writing the corrected data based on the stored numbers of times of write operations.

8. The data refresh method according to claim 7, wherein writing the corrected data to one of the storage areas includes writing the corrected data to the storage area when the number of detected errors in the data stored in the storage area is not larger than a first preset number, and writing the corrected data to a different storage area when the number of errors is larger than the first preset number.

9. The data refresh method according to claim 7, wherein writing the corrected data to one of the storage areas is performed in a preset cycle and the preset cycle is changed according to the number of times of write operations.

10. The data refresh method according to claim 7, wherein the corrected data is written to the storage area when the detected number of errors of the data stored in the storage area is not larger than a first preset number, and the corrected data is written to a different storage area when the number of errors is larger than the first preset number.

11. The data refresh method according to claim 7, wherein the corrected data is written in a preset cycle and the preset cycle is changed according to the number of times of write operations.

12. The data refresh method according to claim 8, wherein the error correction is not executed when the detected number of errors is not larger than a second preset number which is smaller than the first preset number.

13. The data refresh method according to claim 7, wherein the number of errors is detected based on an error-correction code stored in the storage area.

14. The data refresh method according to claim 7, wherein the error correction is executed based on an error-correction code stored in the storage area.

* * * * *